United States Patent
Nishimura et al.

(10) Patent No.: US 8,290,380 B2
(45) Date of Patent: Oct. 16, 2012

(54) ELECTRONIC APPARATUS, IMAGE FORMING APPARATUS, AND CONNECTION CONFIRMATION METHOD FOR CONNECTORS

(75) Inventors: Jun Nishimura, Osaka (JP); Mizue Kadobayashi, Osaka (JP)

(73) Assignee: Kyocera Mita Corporation, Osaka (JP)

( * ) Notice: Subject to any disclaimer, the term of this patent is extended or adjusted under 35 U.S.C. 154(b) by 154 days.

(21) Appl. No.: 12/834,343

(22) Filed: Jul. 12, 2010

(65) Prior Publication Data

US 2011/0020015 A1    Jan. 27, 2011

(30) Foreign Application Priority Data

Jul. 24, 2009    (JP) ................................ 2009-172929

(51) Int. Cl.
     *G03G 15/00*      (2006.01)
(52) U.S. Cl. ........................................................ 399/13
(58) Field of Classification Search .................... 399/12, 399/13, 90
See application file for complete search history.

(56) References Cited

U.S. PATENT DOCUMENTS 5,365,311 A * 11/1994 Matsuoka ...................... 399/13

FOREIGN PATENT DOCUMENTS

JP      2004-345320      12/2007

* cited by examiner

*Primary Examiner* — Hoang Ngo
(74) *Attorney, Agent, or Firm* — K&L Gates LLP (57) ABSTRACT

An electronic apparatus includes a main body and an optional device detachably connected thereto via two connectors each having multiple signal terminals corresponding to various signals. The main body includes a connection confirmation unit that confirms that a specific signal terminal in the multiple signal terminals of each connector is connected; a request-signal generating unit that sends a request signal from the main body to the optional device via a signal terminal other than the specific signal terminal when connection of the specific signal terminal is confirmed by the connection confirmation unit, and requests a reply signal from the optional device; and a communication confirmation unit that determines that the two connectors of the main body and the optional device are connected when confirming that the reply signal is received via the signal terminal other than the specific signal terminal.

16 Claims, 8 Drawing Sheets

FIG.8

ELECTRONIC APPARATUS, IMAGE FORMING APPARATUS, AND CONNECTION CONFIRMATION METHOD FOR CONNECTORS

INCORPORATION BY REFERENCE

This application is based upon and claims the benefit of priority from the corresponding Japanese Patent application No. 2009-172929, filed Jul. 24, 2009, the entire contents of which are incorporated herein by reference.

BACKGROUND

1. Field of the Invention

The present disclosure relates to electronic apparatuses that are connected to optional devices via connectors. More particularly, the disclosure relates to an electronic apparatus and an image forming apparatus that provide confirmation of the connection and to connection confirmation methods.

2. Description of the Related Art

Currently, electronic apparatuses are equipped with various functions; image forming apparatuses connectable to optional devices are an example of such electronic apparatuses. In these types of image forming apparatuses, various kinds of optional devices are detachable therefrom and attachable thereto to allow users to remove paper jams or servicemen to inspect the operation of the devices. Examples of optional devices connectable to the image forming apparatus include: a paper feeder for reducing the number of times sheets need to be supplied; an auto document feeder for automatically and continuously reading documents; and a duplex printing unit. These optional devices are connected to the main apparatus body via connectors.

However, the art does not account for an incompletely inserted state (slantwise-inserted state) of the signal terminals in the connectors of the main apparatus body and an optional device. Although communication is sometimes possible even in a slantwise-inserted state, the communication often becomes abnormal. In the art, when communication is abnormal, it is difficult to determine whether the abnormal communication is due to the slantwise-inserted state of the connectors or a problem in the software.

SUMMARY

It is an advantage of the present disclosure to provide an electronic apparatus and an image forming apparatus that provides for the confirmation of the connection of connectors to assist in determining the cause of the abnormal communication and that allows for prevention of the occurrence of abnormal communication caused by a slantwise-inserted state. The present disclosure also provides a connection confirmation method for connectors.

An electronic apparatus according to an embodiment of the present disclosure includes a main body and an optional device detachably connected to the main body via a pair of connectors each having a plurality of signal terminals corresponding to various kinds of signals. The main body includes a connection confirmation unit, a request-signal generating unit, and a communication confirmation unit. The connection confirmation unit confirms that a specific signal terminal in the plurality of signal terminals of each connector is connected. When the connection confirmation unit confirms that the specific signal terminal is connected, the request-signal generating unit sends a request signal from the main body to the optional device via a signal terminal other than the specific signal terminal and requests a reply signal from the optional device. When the communication confirmation unit confirms that the reply signal is received via the signal terminal other than the specific signal terminal, the communication confirmation unit determines that the two connectors of the main body and the optional device are connected to each other.

An image forming apparatus according to an embodiment of the present disclosure includes the same components as those discussed above, and the main body additionally includes a display reception unit. When the communication confirmation unit cannot confirm reception of the reply signal from the optional device, the display reception unit displays the connection status between the optional device and the main body.

A connection confirmation method according to an embodiment of the present disclosure includes the steps of confirming, requesting, and determining. The confirming step involves confirming that a specific signal terminal of a plurality of signal terminals, for sending and receiving signals, included in each of a pair of connectors is connected; the pair of connectors being respectively located in a main body of an electronic apparatus and an optional device that is attachable to and detachable from the main body. The requesting step involves sending a request signal from the main body to the optional device via a signal terminal other than the specific signal terminal when connection of the specific signal terminal is confirmed, and requesting a reply signal from the optional device. The determining step involves determining that the two connectors of the main body and the optional device are connected to each other when reception of the reply signal is confirmed.

Further features and advantages will become apparent from the following detailed description with reference to the drawings.

DETAILED DESCRIPTION

Image Forming Apparatus

An electronic apparatus according to an embodiment of the present disclosure can be applied to a computer or an image forming apparatus. The following description is directed to an image forming apparatus as an example of an electronic apparatus.

First, a basic copying function of the image forming apparatus according to an embodiment of the present disclosure will be described. The image forming apparatus can be, for example, a multifunction peripheral (MFP) equipped with a printer, a copier, a scanner, a facsimile device, and the like; a digital copier; or a printer. The apparatus has, for example, a copying function, a scanning function, a facsimile function, and a printing function.

Figure 1:
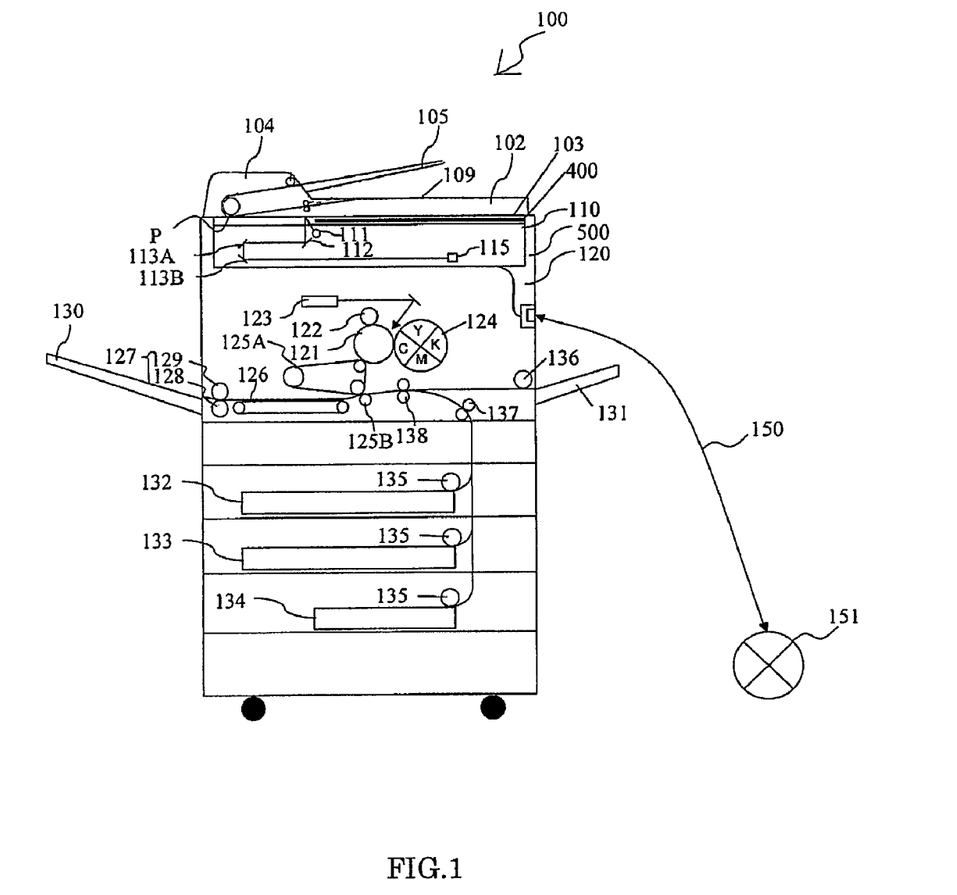
FIG. 1 illustrates the overall configuration of an electronic apparatus (image forming apparatus) according to an embodiment of the present disclosure.

FIG. 1 is a schematic view of an MFP. However, details of components that are not directly relevant to the present disclosure are omitted. The operation of the image forming apparatus when copying a document will be briefly described using an MFP 100 as an example.

When a user uses the MFP 100 for copying, for example, a document, the document can be placed on a platen 103 or in a document holder tray 105 shown in FIG. 1. A print command is inputted using an operating unit 200 provided near the platen 103. Various units (drive units) described below are actuated in response to the command, whereby printing is performed.

As shown in FIG. 1, the MFP 100 according to this embodiment includes a main body 500 and a platen cover 102 attached to the top of the main body 500. The upper surface of the main body 500 is provided with a platen 103, and the platen 103 can be covered and uncovered by opening and closing the platen cover 102. The platen cover 102 is provided with an auto document feeder (optional device) 104, a document holder tray 105, and a document ejection table 109.

Figure 2:
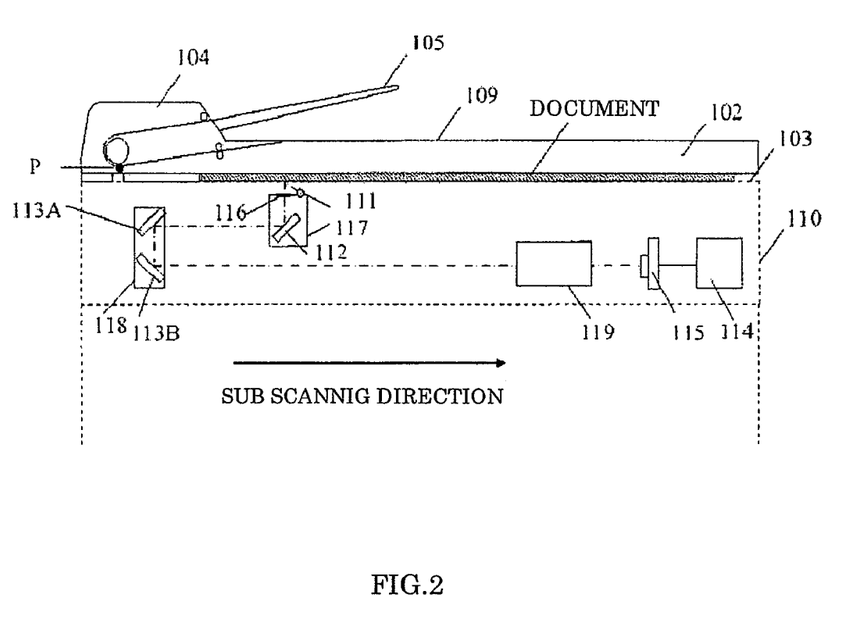
FIG. 2 illustrates the configuration of a read unit of the image forming apparatus according to an embodiment of the present disclosure.

A read unit 110 is provided below the platen 103 and is shown in detail in FIG. 2. The read unit 110 includes: a first movable carriage 117; a second movable carriage 118; a lens group 119 that optically corrects light guided by mirrors; an image sensor 115 that optically receives the light corrected by the lens group 119; and an image-data generator 114 that converts the light optically received by the image sensor 115 into an electric signal and, where necessary, performs corrections and adjustments thereon. The first movable carriage 117 includes: a light source 111 that extends longitudinally in a main scanning direction and emits light towards the platen 103; a slit 116 that selectively passes the light from the platen 103; and a mirror 112 that guides the light from the platen 103. The second movable carriage 118 includes mirrors 113A and 113B that re-reflect the light that is reflected from the first movable carriage 117.

When a document that is placed on the auto document feeder 104 is read, the light source 111 moves to a position where it can emit light to a read position P. The light emitted from the light source 111 passes through the platen 103 and is reflected by the document passing the read position P. The light is then guided to the image sensor 115 via the slit 116, the mirrors 112, 113A, and 113B, and the lens group 119. The image sensor 115 converts the optically-received light into an electric signal and sends the electric signal to the image-data generator 114. The light that is optically received by the image sensor 115 is received as red (R), green (G), and blue (B) analog electric signals by the image-data generator 114. The inputted analog electric signals are analog-to-digital-converted, that is, converted to digital signals. Furthermore, the image-data generator 114 sets the sequentially converted digital signals as unit data and corrects and adjusts the unit data so as to generate image data made of a plurality of unit data.

On the other hand, when the document to be read by the read unit 110 is placed on the platen 103, the first movable carriage 117 moves in a sub scanning direction while emitting light from the light source 111. The second movable carriage 118 moves toward the image sensor 115 at half the speed of the first movable carriage 117 so as to maintain a constant optical path length from the light source 111 to the image sensor 115 constant.

The image sensor 115 converts the light from the document placed on the platen 103 to an electric signal based on the light guided to the mirrors 112, 113A, and 113B, and the image-data generator 114 generates image data based on the electric signal.

A print unit 120 that prints the image data is located below the read unit 110 of the main body 500. Images that can be printed by the print unit 120 include images generated by the image-data generator 114, as mentioned above, and images sent from a network 151 together with an image formation command via a communication cable 150 connected to the MFP 100.

An electrophotography method is used as the printing method performed by the print unit 120. This method involves using a charger 122 to uniformly charge a photosensitive drum 121, using a laser 123 to emit light to the photosensitive drum 121 so as to form a latent image on the photosensitive drum 121, forming a visible image by applying toner to the latent image by using a developer 124, and using a transfer roller to transfer the visible image onto a sheet of paper.

The sheet onto which the visible image is to be printed is originally placed on a manual feed tray 131 or on one of feed trays of feed cassettes 132, 133, and 134.

When the print unit 120 performs printing, a sheet of paper is pulled out from one of the feed trays using a pickup roller 135. The sheet is then delivered between an intermediate transfer belt 125A and a transfer roller 125B using a conveying roller 137 and a registration roller 138. If a sheet of paper placed on the manual feed tray 131 is to be pulled out, the sheet may be removed by using a manual-feed-tray pickup roller 136.

After the print unit 120 transfers a visible image that is on the intermediate transfer belt 125A onto the sheet, delivered between the intermediate transfer belt 125A and the transfer roller 125B, the print unit 120 conveys the sheet to a fixing unit 127, via a conveying belt 126, so that the visible image can be fixed on the sheet. The fixing unit 127 includes a heating roller 128 including a built-in heater and a pressing roller 129 that is in pressure contact with the heating roller 128. When the sheet passes between the heating roller 128 and the pressing roller 129, the visible image is fixed onto the sheet due to the heat and the force that is applied to the sheet. The print unit 120 discharges the sheet passing the fixing unit 127 onto a discharge tray 130.

The basic copying function of the MFP 100 has been described above. The MFP 100 cooperatively actuates the aforementioned units (i.e., the read unit 110 and the print unit 120) so as to provide other functions. These functions include facsimile sending/receiving functions, printing functions, scanning functions, post-processing functions, and memory functions, for the user.

Figure 3:
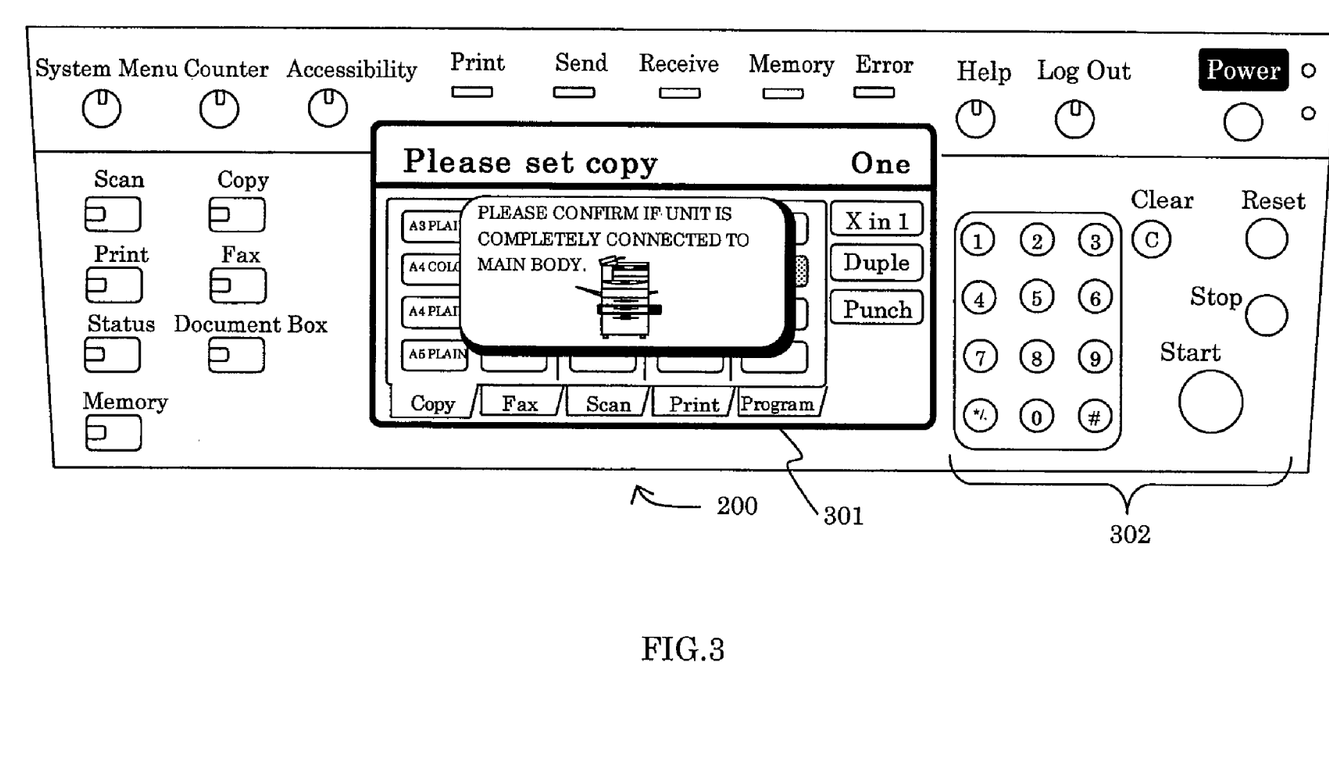
FIG. 3 illustrates an operating unit of the image forming apparatus according to an embodiment of the present disclosure.

FIG. 3 illustrates an example of an external view of the operating unit 200 provided in the MFP 100. The user may use a touch panel (display) 301 and operating keys 302 provided on the operating unit 200 to execute the above-discussed functions and to input various setting conditions.

Figure 4:
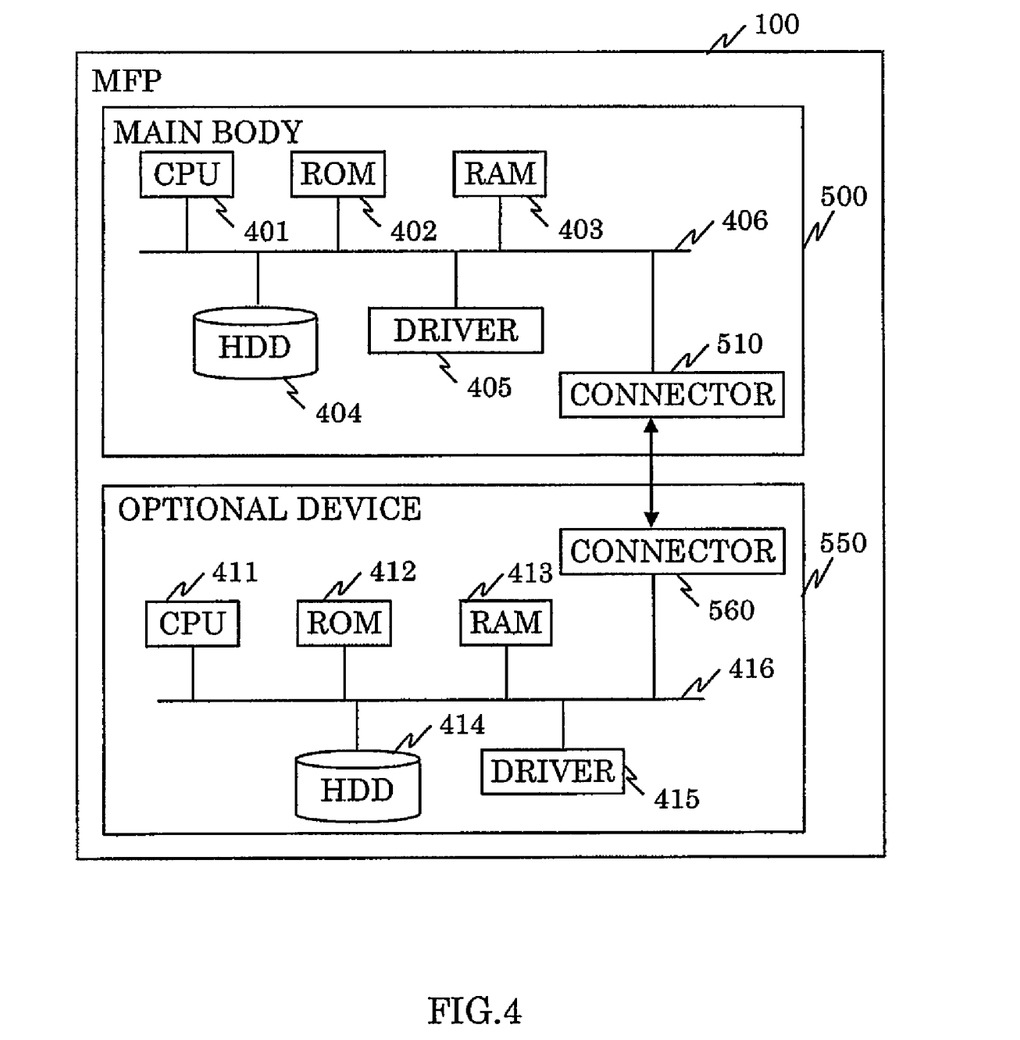
FIG. 4 illustrates the configuration of control-system hardware of the image forming apparatus according to an embodiment of the present disclosure.

Next, the configuration of the control-system hardware of the MFP 100 will be described with reference to FIG. 4. FIG. 4 schematically illustrates the configuration of the control-system hardware in the MFP 100. However, details of components that are not directly relevant to the present disclosure are omitted.

In a control circuit of the MFP 100, a central processing unit (CPU) 401, a read-only memory (ROM) 402, a random access memory (RAM) 403, a hard disk drive (HDD) 404, and a driver 405 corresponding to each drive unit are connected to each other via an internal bus 406. The CPU 401 uses, for example, the RAM 403 as a working area and executes programs stored in the ROM 402, the HDD 404, and the like. Based on the execution results, the CPU 401 receives data and commands from the driver 405 and the operating unit 200, and controls the operation of the individual drive units shown in FIGS. 1 and 2.

On the other hand, each of the optional devices 550 (such as the auto document feeder 104) are also provided with a control circuit for controlling the operation of the optional device 550. The control circuit also contains a CPU 411. In the control circuit of the optional device 550, storage elements, such as a ROM 412, a RAM 413, and an HDD 414, and a driver 415, corresponding to each drive unit, may be connected to each other via an internal bus 416.

The CPU 411 in the optional device 550 can communicate with the CPU 401 in the main body 500. When necessary, the CPU 401 in the main body 500 sends an operation command to the CPU 411, in the optional device 550, so as to control the optional device 550.

Connectors 510 and 560 are used to connect the main body 500 and the optional device 550. With these connectors 510 and 560, the CPU 401 in the main body 500 and the CPU 411 in the optional device 550 are connected in a communicable manner, and power is supplied from the main body 500 to the optional device 550.

Optional Device and Communication Process

Figure 5:
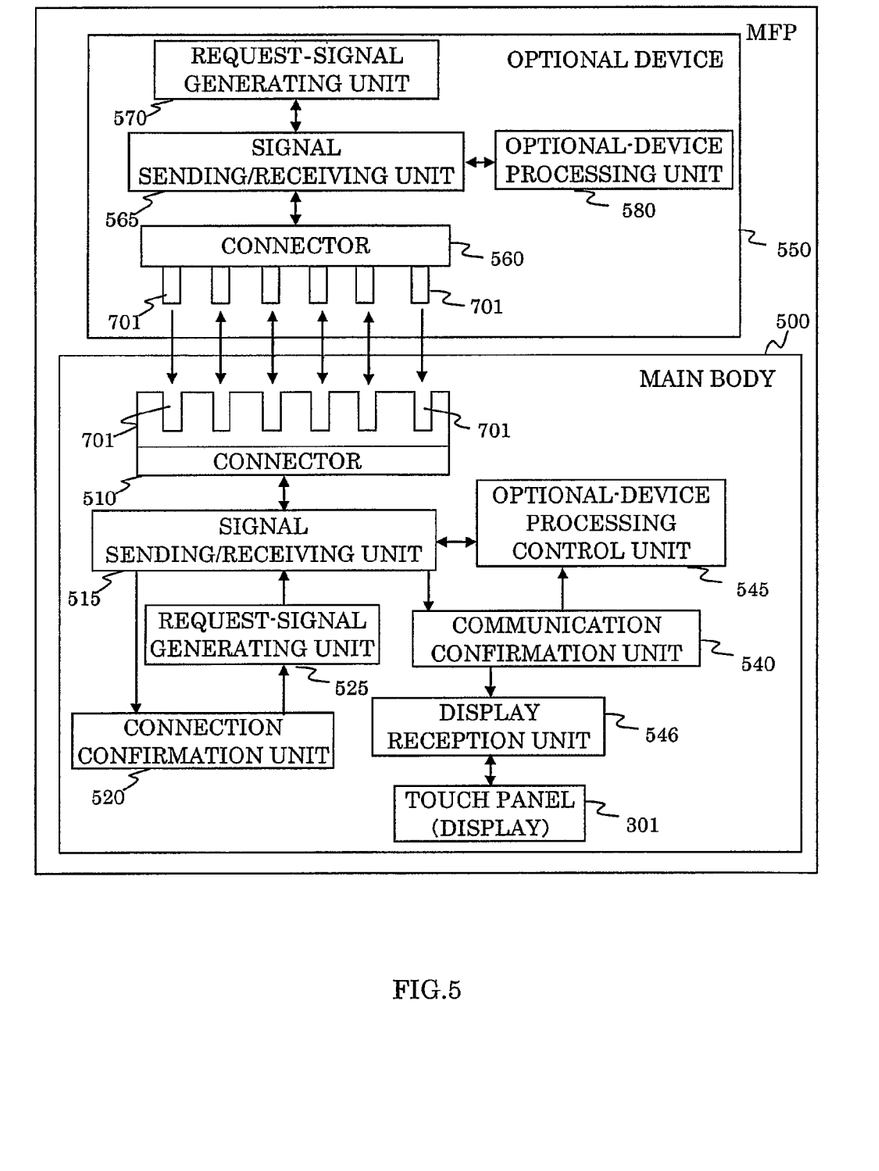
FIG. 5 is a functional block diagram of the image forming apparatus according to an embodiment of the present disclosure.
Figure 6:
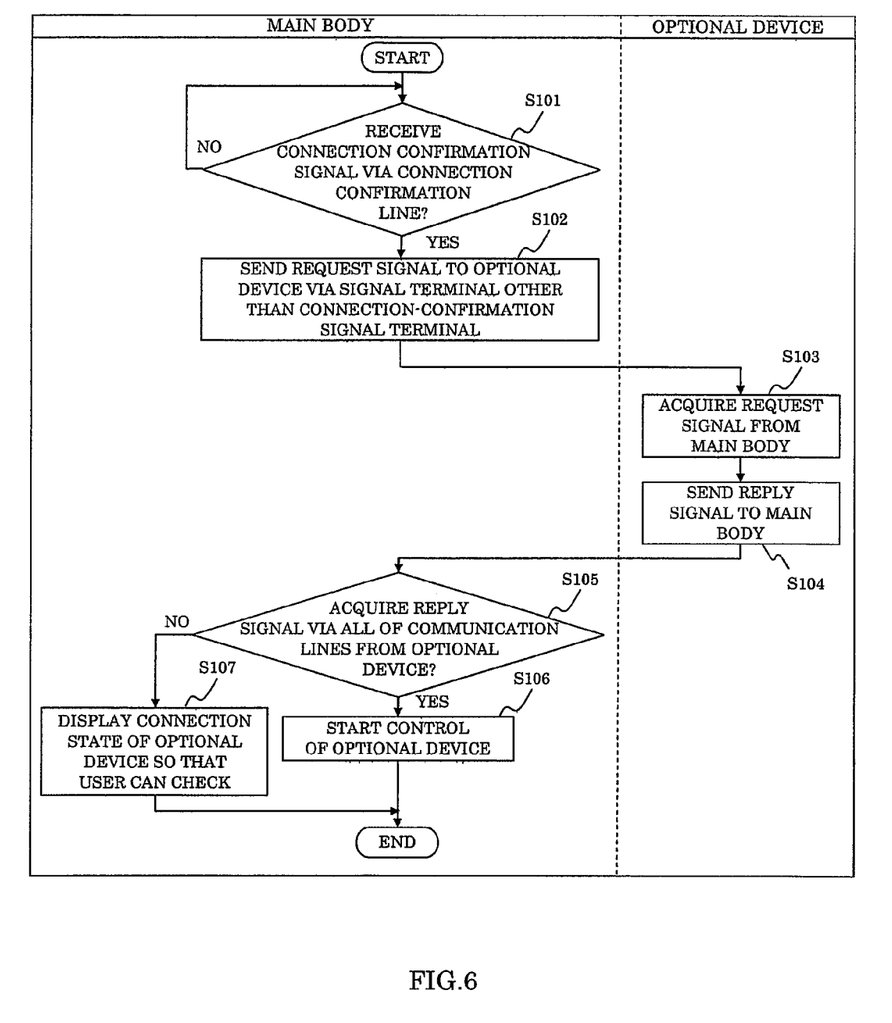
FIG. 6 is a flow chart showing a communication process between an optional device and a main body of the image forming apparatus according to an embodiment of the present disclosure.

Next, a communication process having the optional device 550 in the MFP 100, which is an example of an electronic apparatus according to the present disclosure, will be described with reference to FIGS. 5 to 8. FIG. 5 is a functional block diagram of the MFP 100 according to the present disclosure. FIG. 6 is a flow chart showing a communication process with the optional device 550 in the MFP 100 according to the present disclosure. An alphabetical character "S" given before each numerical value in the flow chart denotes a "step".

To connect the optional device 550 to the main body 500, a user can first connect the connector 560 of the optional device 550 to the connector 510 of the main body 500.

As shown in FIGS. 7A to 7D, the connectors 560 and 510 of the optional device 550 and the main body 500 are each provided with a plurality of signal terminals (signal-terminal group 702). The signal terminals in the signal-terminal group 702 function as signal terminals for connecting to a power line, a grounding line, a plurality of communication lines, and a connection confirmation line, described below. The optional device 550 and the main body 500 are connected to each other via these lines. Each of the connectors shown in FIGS. 7A to 7D is a male-type connector having, for example, male signal terminals. On the other hand, a female-type connector is configured to have female signal terminals that correspond to the positions of the male signal terminals. Specifically, the two connectors are a pair of male and female connectors equipped with signal terminals that correspond to various kinds of signals.

The connector 560 of the optional device 550 and the connector 510 of the main body 500 have a male-and-female relationship. For example, if the connector 510 of the main body 500 is a male type, the connector 560 of the optional device 550 is a female type; whereas if the connector 510 of the main body 500 is a female type, the connector 560 of the optional device 550 is a male type. In this embodiment, the connector 510 of the main body 500 is a female type, and the connector 560 of the optional device 550 is a male type.

Figure 7A:
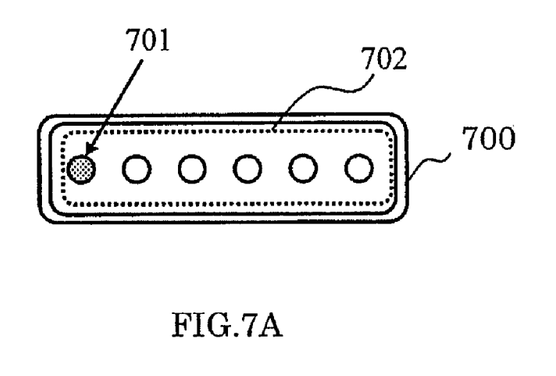
FIGS. 7A to 7D each illustrate an example of a connector according to an embodiment of the present disclosure.
Figure 7B:
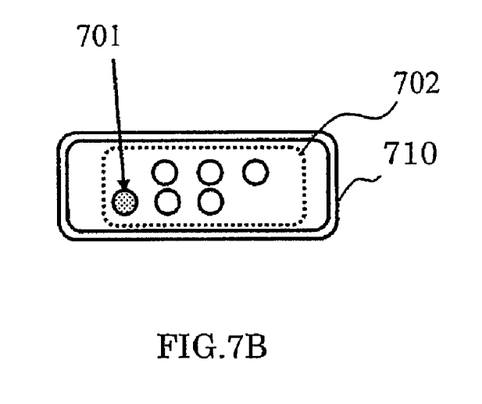
Figure 7C:
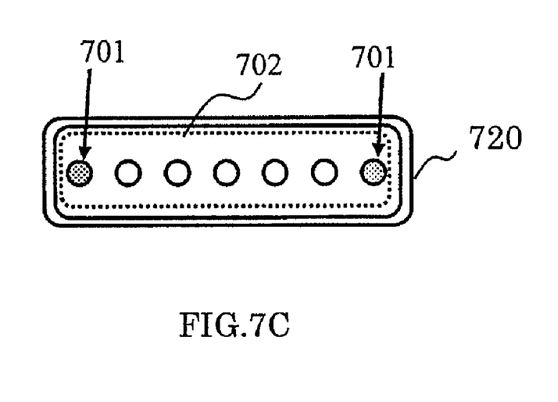
Figure 7D:
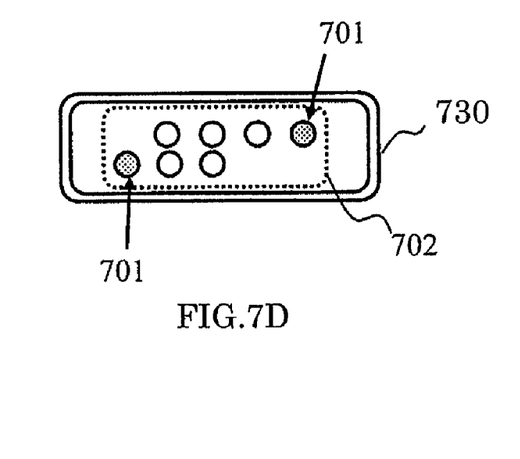

FIGS. 7A and 7C each show a connector wherein the signal terminals are arranged in a single row, whereas FIGS. 7B and 7D each show a connector wherein the signal terminals are arranged in multiple rows (two rows). In the signal terminals, the number of communication lines to be used is set to a value necessary for controlling the optional device 550 to be connected to the main body 500.

Of the signal terminals, a specific signal terminal for connecting to the connection confirmation line will be referred to as "connection-confirmation signal terminal 701". The connection-confirmation signal terminal 701 is connectable to the connection confirmation line and sends a signal for confirming the connection between the main body 500 and the optional device 550 from the optional device 550 to the main body 500. When the connection-confirmation signal terminals 701 of the connectors 560 and 510 are connected to each other, a connection confirmation signal is sent from the optional device 550 to the main body 500 via the connection confirmation line.

For example, of the signal-terminal group 702 located in a connector 700 shown in FIG. 7A, the signal terminal at the left end (one end) is designated to serve as a connection-confirmation signal terminal 701, and the other signal terminals in the signal-terminal group 702 are designated to serve as signal terminals for connecting to a plurality of communication lines. Although a connector also requires a power line and a grounding line, the description and illustration thereof have been omitted since they are not particularly important in the present disclosure. If the signal terminals are positioned in multiple rows, as in a connector 710 shown in FIG. 7B, the signal terminal at the lower left end (one end of the upper row or the lower row) of the signal terminals is designated to serve as a connection-confirmation signal terminal 701.

When the signal terminals at the opposite ends of the signal-terminal group 702 are completely inserted, there is a high probability that the remaining signal terminals between the two signal terminals are also completely inserted. In other words, a slantwise-inserted state can be prevented. For example, in a connector 720 shown in FIG. 7C, the signal terminals at the opposite ends of the signal-terminal group 702 are designated to serve as connection-confirmation signal terminals 701.

Furthermore, if the signal terminals are positioned in multiple rows, multiple signal terminals including a signal terminal disposed at one end of an upper row and a signal terminal located at the other end of a lower row are designated to serve as connection-confirmation signal terminals 701. Specifically, when the multiple connection-confirmation signal terminals 701 are completely inserted, there is a high probability that the remaining signal terminals between the two connection-confirmation signal terminals 701 are also completely inserted. In a connector 730 shown in FIG. 7D, for example, two signal terminals located at the right end of the upper row and the left end of the lower row, respectively, of the signal-terminal group 702 are designated to serve as the connection-confirmation signal terminals 701.

A connection confirmation unit 520 located in the main body 500 determines in step S101 in FIG. 6 whether or not the connection-confirmation signal terminal 701 is inserted in an inlet (female connection-confirmation signal terminal 701) of the connector 510 of the main body 500.

For example, the user may insert the connection-confirmation signal terminal 701 of the optional device 550 completely into the inlet of the connector 510 of the main body 500 so as to connect the connector 560 of the optional device 550 to the connector 510 of the main body 500. When the connection-confirmation signal terminals 701 is connected by the user, a connection confirmation signal is sent from the optional device 550 to the main body 500 via the connection confirmation line connected to the connection-confirmation signal terminals 701. When the main body 500 receives the connection confirmation signal, the connection confirmation unit 520 determines that the connection-confirmation signal terminal 701 is in an inserted state. If two (multiple) connection-confirmation signal terminals 701 are provided, as in this embodiment, the connection confirmation signal is sent when all of the connection-confirmation signal terminals 701 are inserted.

As discussed above, when the connection confirmation unit 520 of the main body 500 confirms in step S101 (YES) that the connection-confirmation signal terminal 701 is inserted, the connection confirmation unit 520 notifies a request-signal generating unit 525 that the connection-confirmation signal terminal 701 is inserted. In response to this notification, the request-signal generating unit 525 notifies a signal sending/receiving unit 515 to send request signals to the optional device 550 via communication signal terminals (i.e., communication lines) other than the connection-confirmation signal terminal 701. In response to this notification, the signal sending/receiving unit 515 sends request signals to the optional device 550 via the communication lines in step S102.

As discussed above, when the request signals are sent from the main body 500, a request-signal acquisition unit 570 provided in the optional device 550 acquires the request signals via a signal sending/receiving unit 565 of the optional device 550 in step S103.

After acquiring the request signals, the request-signal acquisition unit 570 of the optional device 550 notifies the signal sending/receiving unit 565 to send reply signals to the main body 500 via the communication lines. In response to this notification, the signal sending/receiving unit 565 sends reply signals to the main body 500 in step S104.

A communication confirmation unit 540 located in the main body 500 acquires the reply signals from the optional device 550 via the signal sending/receiving unit 515. In this case, the communication confirmation unit 540 determines, in step S105, whether or not reply signals were acquired from all of the communication lines.

When the communication confirmation unit 540 acquires reply signals from all of the communication lines, it is then determined in step S105 (YES) that the connector 560 of the optional device 550 is completely connected to the connector 510 of the main body 500. Then, the communication confirmation unit 540 notifies an optional-device processing control unit 545 that the optional device 550 is processable (controllable).

In response to this notification, the optional-device processing control unit 545 controls an optional-device processing unit 580 provided in the optional device 550 via the signal sending/receiving unit 515 in step S106. For example, the optional-device processing control unit 545 controls the optional device 550 based on the conditions set via the touch panel 301 and the operating keys 302.

On the other hand, if the communication confirmation unit 540 does not receive reply signals from all of the communication lines, it is then determined in step S105 (NO) that the connector 560 of the optional device 550 is not completely connected to the connector 510 of the main body 500.

For example, if reply signals from all of the communication lines are not confirmed after a predetermined time period from the time the request signal was sent (e.g., 0.1 seconds), the communication confirmation unit 540 then determines that the two connectors are not completely connected to each other.

When the connectors are determined to not be completely connected to each other, the communication confirmation unit 540 notifies a display reception unit 546 to display the connection status of the optional device 550 so that the user can check the connection status.

Figure 8:
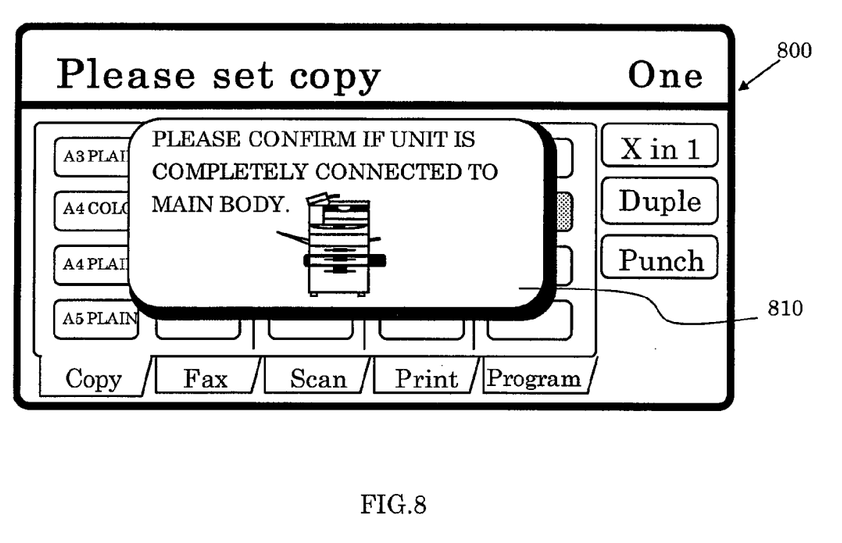
FIG. 8 illustrates an example of a window displayed on a display of the image forming apparatus according to an embodiment of the present disclosure.

In response to this notification, the display reception unit 546 displays a pop-up image 810, as shown in FIG. 8, on an initial window 800 of the touch panel 301 in step S107 so as to inform the user that the optional device 550 is not connected.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An electronic apparatus comprising:
   a main body and an optional device detachably connected to the main body via a pair of connectors each having a plurality of signal terminals corresponding to various kinds of signals; and
   the main body comprises
   a connection confirmation unit that confirms that a specific signal terminal in the plurality of signal terminals of each connector is connected,
   a request-signal generating unit that sends request signals from the main body to the optional device via multiple signal terminals other than the specific signal terminal when the connection confirmation unit confirms that the specific signal terminal is connected, and requests reply signals from the optional device, and
   a communication confirmation unit that determines that the two connectors of the main body and the optional device are connected to each other when the communication confirmation unit confirms that the reply signals is received via all of the multiple signal terminals other than the specific signal terminal.

2. The electronic apparatus according to claim 1, wherein a connection confirmation signal is outputted from the optional device to the main body when the specific signal terminals of the two connectors are connected to each other, and the connection confirmation unit confirms that the specific signal terminals are connected to each other based on the connection confirmation signal.

3. The electronic apparatus according to claim 1, wherein if the communication confirmation unit cannot confirm reception of the reply signals from all of the signal terminals after a predetermined time period from the time the request signals are sent from the request-signal generating unit, the communication confirmation unit determines that the two connectors are not completely connected to each other.

4. The electronic apparatus according to claim 1, wherein the plurality of signal terminals in each connector are positioned in a row, and the specific signal terminal in each connector is located at one end of or each end of the plurality of signal terminals in a specific direction thereof.

5. The electronic apparatus according to claim 1, wherein the plurality of signal terminals in each connector are positioned in multiple rows including an upper row and a lower row, and of the multiple rows of signal terminals, the specific signal terminal in each connector is located at one of or each of one end of the upper row in a specific direction of the signal terminals and another end of the lower row in the specific direction.

6. The electronic apparatus according to claim 1, wherein the signal terminals of the pair of connectors include a pair of male and female signal terminals.

7. The electronic apparatus according to claim 1, wherein the optional device includes:
a signal sending/receiving unit that receives the request signals and sends the reply signals; and
a request-signal acquisition unit that acquires the request signals via the signal sending/receiving unit.

8. The electronic apparatus according to claim 7, wherein after acquiring the request signals, the request-signal acquisition unit notifies the signal sending/receiving unit to send the reply signals to the main body.

9. The electronic apparatus according to claim 1, wherein the main body comprises a display, and when the communication confirmation unit cannot confirm reception of the reply signals from the optional device, the display displays a connection status between the optional device and the main body.

10. An image forming apparatus comprising:
a main body and an optional device detachably connected to the main body via a pair of connectors each having a plurality of signal terminals corresponding to various kinds of signals, the main body comprises:
a connection confirmation unit that confirms that a specific signal terminal in the plurality of signal terminals of each connector is connected;
a request-signal generating unit that sends request signals from the main body to the optional device via multiple signal terminals other than the specific signal terminal when the connection confirmation unit confirms that the specific signal terminal is connected, and requests reply signals from the optional device;
a communication confirmation unit that determines that the two connectors of the main body and the optional device are connected to each other when the communication confirmation unit confirms that the reply signals is received via all of the multiple signal terminals other than the specific signal terminal; and
a display reception unit that displays a connection status between the optional device and the main body when the communication confirmation unit cannot confirm reception of the reply signals from the optional device.

11. The image forming apparatus according to claim 10, comprising an operating unit having a display and an operating key, the display reception unit causes the display to display the connection status between the optional device and the main body.

12. The image forming apparatus according to claim 11, wherein when the communication confirmation unit determines that the main body and the optional device are connected to each other, the optional device is controlled pursuant to a condition set via the operating unit.

13. A connection confirmation method for connectors, comprising:
confirming that a specific signal terminal of a plurality of signal terminals, for sending and receiving signals, included in each of a pair of connectors is connected, the pair of connectors being respectively located in a main body of an electronic apparatus and an optional device attachable to and detachable from the main body;
sending request signals from the main body to the optional device via multiple signal terminals other than the specific signal terminal when connection of the specific signal terminal is confirmed, and requesting reply signals from the optional device via all of the multiple signal terminals other than the specific signal terminal; and
determining that the two connectors of the main body and the optional device are connected to each other when reception of the reply signal is confirmed.

14. The connection confirmation method for connectors according to claim 13, comprising:
acquiring the request signals by the optional device; and
sending the reply signals from the optional device to the main body after the optional device acquires the request signals.

15. The connection confirmation method for connectors according to claim 13, comprising displaying a connection status between the optional device and the main body when reception of the reply signals is not confirmed.

16. The connection confirmation method for connectors according to claim 13, wherein the signal terminals of the pair of connectors include a pair of male and female signal terminals.

* * * * *